United States Patent [19]

Matsumoto

[11] Patent Number: 5,627,912

[45] Date of Patent: May 6, 1997

[54] INSPECTION METHOD OF INCLINATION OF AN IC

[75] Inventor: Koji Matsumoto, Tokyo, Japan

[73] Assignee: Yozan Inc., Tokyo, Japan

[21] Appl. No.: 568,439

[22] Filed: Dec. 6, 1995

Related U.S. Application Data

[63] Continuation of Ser. No. 405,405, Mar. 15, 1995, abandoned, which is a continuation of Ser. No. 82,421, Jun. 28, 1993, abandoned.

[30] Foreign Application Priority Data

Jun. 29, 1992 [JP] Japan ................................. 4-194920

[51] Int. Cl.$^6$ ............................................. G06K 9/00
[52] U.S. Cl. .......................... 382/146; 382/151; 382/168
[58] Field of Search .................................. 348/87, 583, 94, 348/95; 395/137, 904; 382/141, 146, 151, 168, 170, 289

[56] References Cited

U.S. PATENT DOCUMENTS

| | | | |
|---|---|---|---|
| 4,238,780 | 12/1980 | Doemens | 348/87 |
| 4,696,047 | 9/1987 | Christian et al. | 382/8 |
| 4,847,911 | 7/1989 | Morimoto et al. | 382/8 |
| 4,969,199 | 11/1990 | Nara | 382/8 |
| 4,981,372 | 1/1991 | Morimoto et al. | 348/87 |
| 5,001,766 | 3/1991 | Baird | 382/46 |
| 5,007,097 | 4/1991 | Mizuoka et al. | 382/8 |
| 5,157,734 | 10/1992 | Chen et al. | 382/8 |
| 5,189,707 | 2/1993 | Suzuki et al. | 382/8 |

FOREIGN PATENT DOCUMENTS

| | | | |
|---|---|---|---|
| 0062335 | 10/1982 | European Pat. Off. | H03K 13/00 |
| 0222072 | 5/1987 | European Pat. Off. | H05K 13/04 |

OTHER PUBLICATIONS

Baartman et al., "Placing Surface Mount Components Using Coarse/Fine Positioning and Vision", IEEE Transactions on Components, Hybrids, and Manufacturing Technology, Sep. 1990, No. 3, New York, pp. 559–564.

Loomis, "Edge–Finding Algorithm with Subpixel Resolution", Vision '89, Conference Proceedings, Apr. 1989, pp. 8–33 to 8–60.

Schalkoff, *Digital Image Processing and Computer Vision*, John Wiley & Sons, pp. 196–197, 262–279 (1989).

Primary Examiner—Andrew Johns
Attorney, Agent, or Firm—Cushman, Darby & Cushman IP Group of Pillsbury Madison & Sutro LLP

[57] ABSTRACT

The present invention has a purpose to provide method of measuring the inclination of an IC in order to correct its position quickly and precisely without binzarized images. The method according to this invention: 1) defines an inspection area including open ends of IC pins, 2) extracts longitudinal edges and open ends of pin of each IC pin from a density projection of each inspection area, 3) selects a representative point for each inspection area on a line along the open ends of the pins and calculates a center and inclination of an IC according to a difference of coordinates of representative points on opposite sides of the IC.

16 Claims, 3 Drawing Sheets

INSPECTION METHOD OF INCLINATION OF AN IC

This is a continuation of application Ser. No. 08/405,405, filed on Mar. 15, 1995, which was abandoned upon the filing hereof, which is a continuation of application Ser. No. 08/082,421 filed Jun. 28, 1993 now abandoned.

FIELD OF THE INVENTION

The present invention relates to a method of measuring the inclination of an IC to fix its position for mounting on a circuit board.

BACKGROUND OF THE INVENTION

To mount an integrated circuit ("IC") on a predetermined position on a circuit board, it is necessary to set an exact position of the IC. In order to measure the exact position of the IC, it is necessary to locate the center of the IC and measure its angle of inclination. In the case extracting information regarding the center of the IC and its angle of the inclination using image processing methods, the extraction process is applied to a binarized image in order to make the processing speed high. However, the binarized image is easily damaged by a change in the degree of brightness of lights illuminating the IC, and such methods have trouble measuring exact position.

SUMMARY OF THE INVENTION

The present invention solves the above conventional problems, and it has a purpose to provide an inspection method of inclination of an IC in order to fix a position of IC speedily and precisely without the image information of binarized images.

An inspection method of inclination of an IC according to this invention defines a inspection area including open ends of IC pins on each side of IC package, extracts longitudinal edges and open ends of each IC pin from a density projection of each checking area, calculates a representative point of each checking area on a line along the open ends and calculates an inclination of an IC according to a difference of coordinates of a representative point of the checking area positioning on the opposite side.

PREFERRED EMBODIMENT OF THE PRESENT INVENTION

Figure 1:
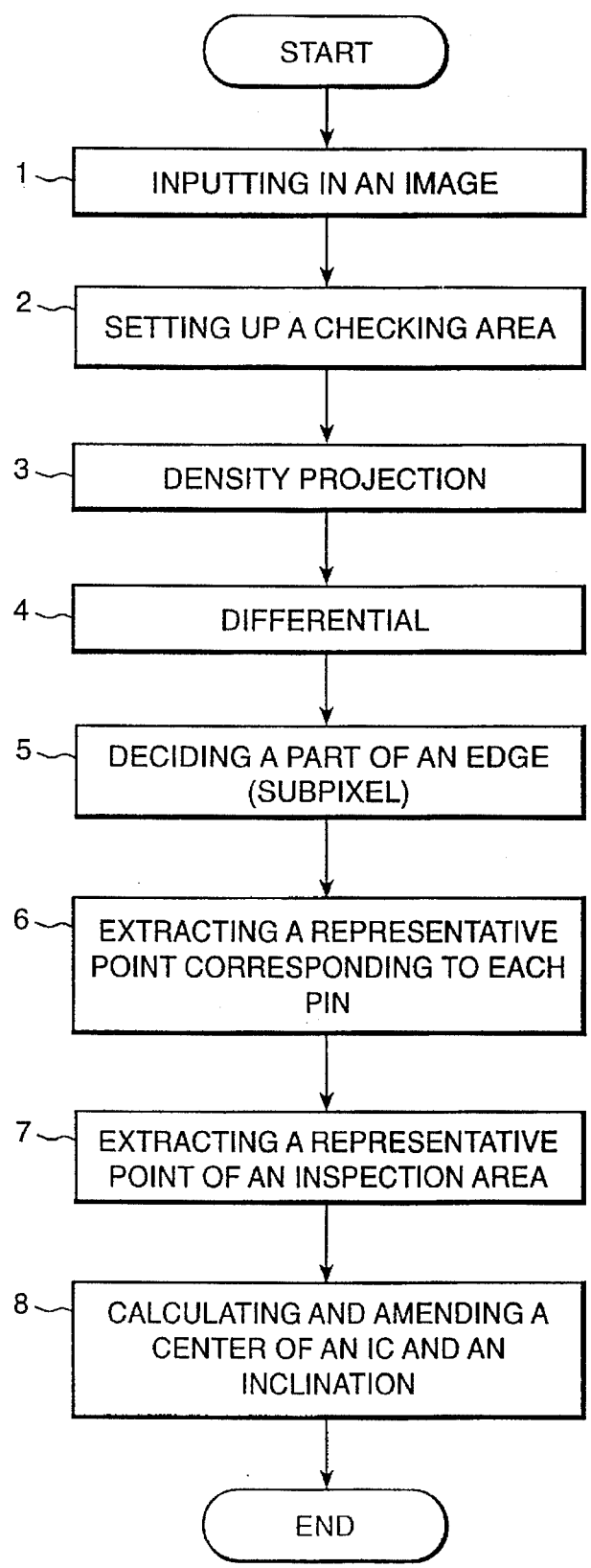
FIG. 1 is a flow chart showing an embodiment of the present invention.

Hereinafter, an embodiment of method of measuring the inclination of an IC of the present invention is described with reference to the attached drawings. FIG. 1 is a flow chart showing an embodiment of the present invention. Reference will be made to other drawings as they relate to steps of FIG. 1.

First, an image of an IC with pins on 4 sides of QFT type etc. is taken on step 1. The darkness of the background differs from that of the pins.

Figure 2:
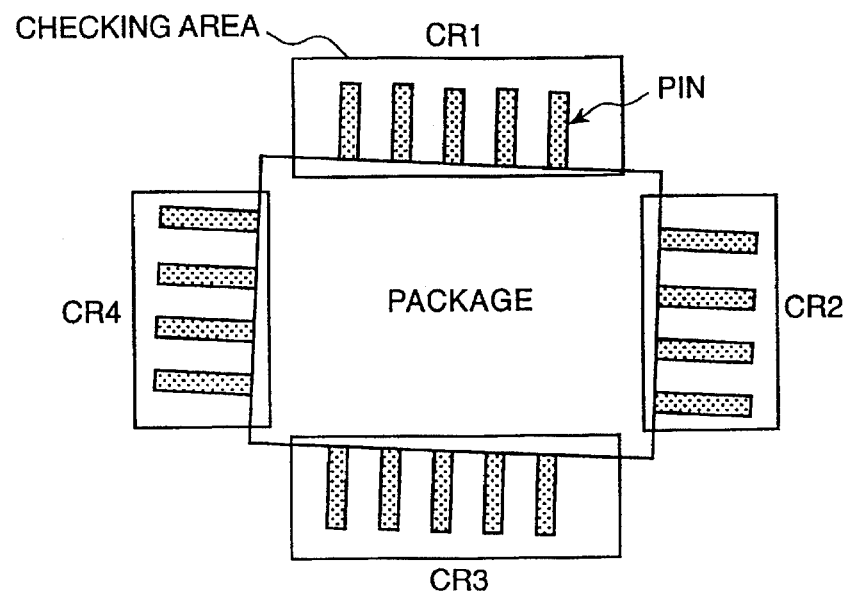
FIG. 2 is a conceptual diagram showing a setting of a checking area.

In step 2, checking regions are set around predetermined positions in the image of the IC. Checking regions are designated as CR1 to CR4 (FIG. 2). One checking region is positioned on each side of the IC and includes open ends of the IC pins.

Figure 3:
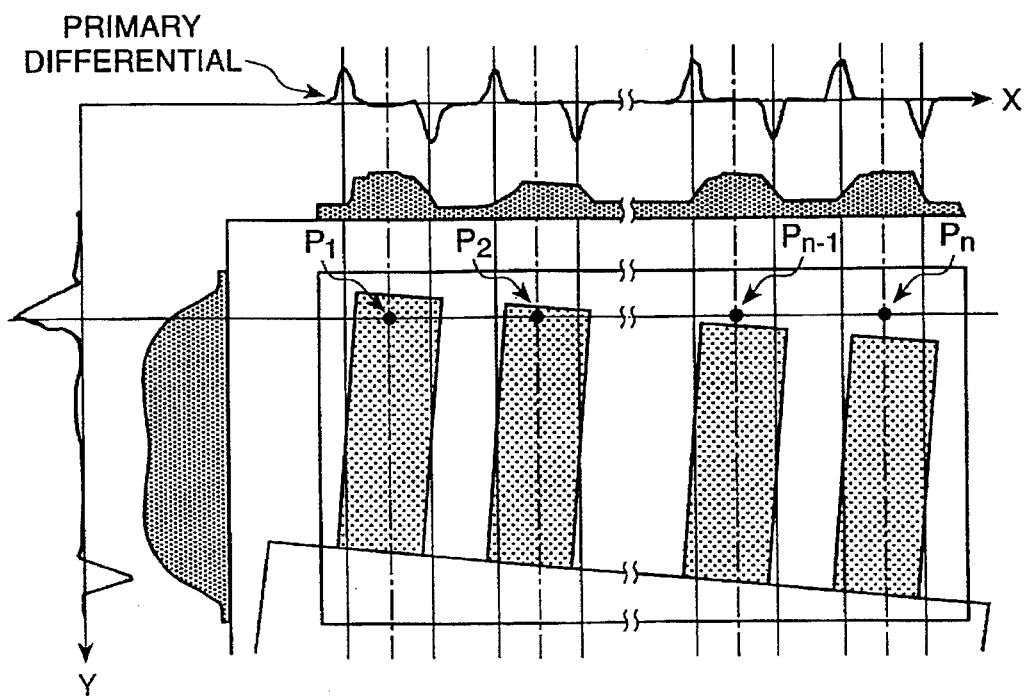
FIG. 3 is a conceptual diagram showing a density projection, a primary differential and each pin of a checking area.

Density projections are generated along directions of the X-axis and the Y-axis of each checking regions in step 3. FIG. 3 shows a density projection of a checking regions CR1 as an example. The density projection is calculated by integrating gray level values (darkness) of an image. The density projection has highly reliable information compared with a binarized image which has lost information during information compression (i.e., lost during binarization).

In step 4, the primary differential (rate of change of the density projection) is determined. FIG. 3 shows the differential as a thick line. As the result, each longitudinal edge of the IC pins is emphasized as a peak in the differential along the direction of the X-axis. A line along the open ends of the IC pins is emphasized as a peak in the differential along the direction of the Y-axis.

Figure 4:
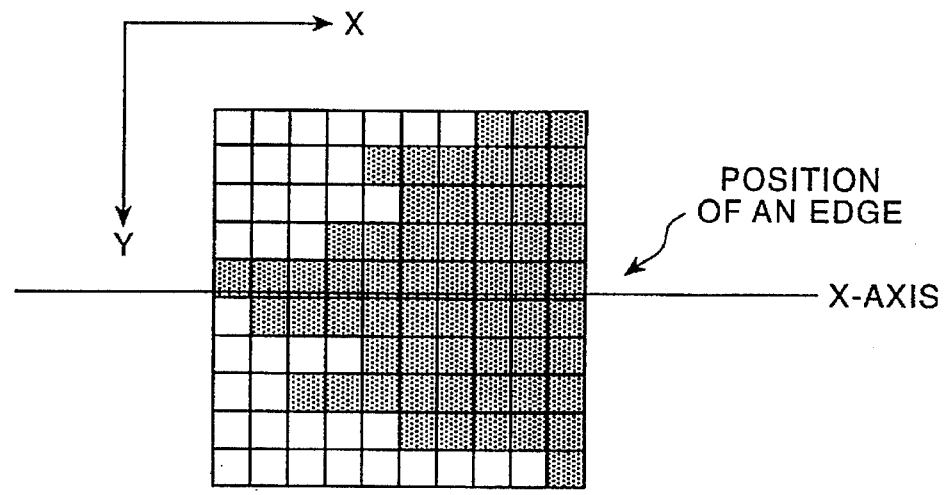
FIG. 4 is a diagram for explaining a position of an edge of a subpixel unit.

In step 5, a position of an edge is measured by detecting a peak in the differential using a subpixel unit, where a coordinate exists between subpixels. FIG. 4 shows a part of the edge by a pixel unit of an image in a direction of Y-axis. It is usual that there are uneven in an image as FIG. 4. In order to calculate more accurate position of the edge, that is Y-coordinates from such an image data, subpixels must be considered. As a result, it is possible to obtain a more exact and precise Y-coordinates (FIG. 4 shows a line of X-axis of the coordinates.) than the method obtaining coordinates by a pixel unit with the maximum value of a primary differential. The coordinates of a direction of X-axis is also calculated by a subpixel unit.

In order to extract a part of an edge, the predetermined value calculated in experience is set as a threshold value, and a location is accepted as an edge when the primary differential value is over the threshold value. In order to standardize the threshold value, it is better to perform normalization after determining the primary differential.

In step 6, a point corresponding to each IC pin is selected. The point is illustrated in FIG. 3 at each intersection of a broken line (showing a central position of longitudinal edges of each pin) and a thick line (showing a median position of open edges of each pin). The cross points are labeled as P1 to Pn in the figure.

In step 7, a mean location of X-coordinates of points from P1 to Pn is calculated and the mean location is selected as a representative point RP1 for checking region CR1.

Figure 5:
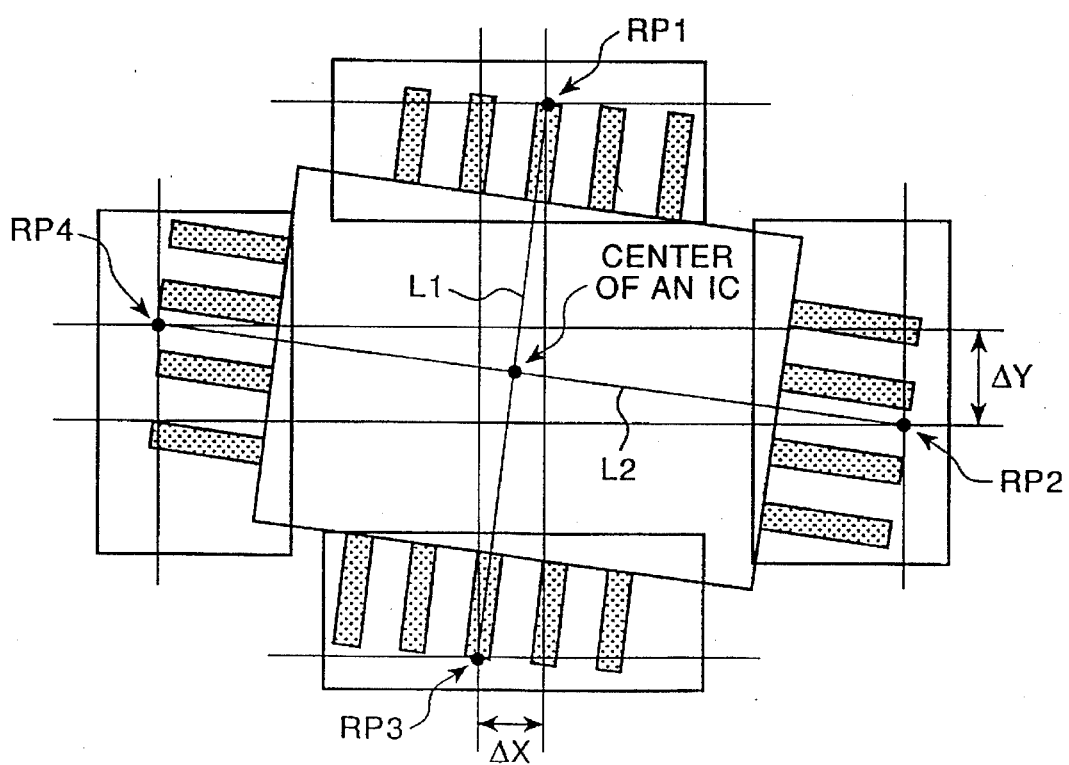
FIG. 5 is a conceptual diagram showing a center of an IC.

A representative point is selected in all checking regions as described above. They are shown by RP1 to RP4 in FIG. 5.

In step 8, lines connecting representative points in opposite sides of the IC are calculated and defined as L1 and L2. Then, a crossing point of the lines is selected as a central point of the IC. An inclined angle can be calculated according to $\Delta Y \Delta X$ when a difference of X-coordinates of RP1 and RP3 is defined as $\Delta X$ and a difference of a Y-coordinates of RP2 and RP4 is defined as $\Delta Y$.

It is possible to calculate an inclined angle quickly by the present invention because the checking regions are small and the necessary time for the processings is short.

The IC is rotated by the amount of the measured inclined angle and its inclination is thereby corrected.

The present invention mentioned above can exactly measure the inclination of an IC precisely in high speed without the information of a binarized image, and correct the inclination after the measurement.

I claim:

1. A method of measuring the orientation of an integrated circuit having a first set of pins on a first side thereof and a second set of pins on a second side opposing the first side, wherein a line extending between the first and the second side of the integrated circuit defines a first axis of the integrated circuit, the method comprising steps of:

generating a pixel image of the integrated circuit in a reference coordinate system having a first reference axis and a second reference axis, the pixel image having a first pixel axis corresponding to the first axis of the integrated circuit, the first pixel axis being parallel to one of the first reference axis and the second reference axis if the integrated circuit is disposed at a zero angle of inclination, the first pixel axis being disposed at a non-zero angle with respect to both the first and the second reference axes if the integrated circuit is disposed at a non-zero angle of inclination, pixels in the pixel image representing relative darknesses of the integrated circuit and a background at discrete locations;

generating density projections of the pins in each of the first and the second set of pins along the first and the second reference axes;

detecting coordinates of termini of the first and the second set of pins along the first and the second references axes from the density projections of the pins in the first and the second sets of pins;

determining reference points corresponding to the pins in the first and the second sets of pins based on the detected coordinates of termini of the first and the second set of pins in the first and the second reference axes, each pin having one reference point associated therewith, the reference points associated with pins in a same set of pins being aligned in parallel with the first reference axis;

selecting a first location representative of the first set of pins based on the reference points associated with the pins in the first set;

selecting a second location representative of the second set of pins based on the reference points associated with the pins in the second set;

determining a first relative displacement of the first and the second locations along one of the first and the second reference axes; and generating a quantitative measure of inclination of the integrated circuit relative to at least one of the first and the second reference axis based on the first relative displacement.

2. The method of claim 1, wherein the integrated circuit includes a third set of pins located on a third side thereof and a fourth set of pins on a fourth side opposing the third side, further comprising the steps of:

generating density projections of the pins in each of the third and the fourth set of pins along the first and the second reference axes;

detecting coordinates of termini of the third and the fourth sets of pins along the first and the second references axes from the density projections of the pins in the third and the fourth sets of pins;

determining additional reference points corresponding to pins in the third and the fourth sets of pins based on the detected coordinates of the third and the fourth sets of pin termini along the first and the second reference axes, each pin in the third and forth sets of pins having one of the additional reference points associated therewith, the additional reference points associated with the pins in a same set of pins being aligned in parallel with the second reference axis;

selecting a third location representative of the third set of pins based on the additional reference points associated with the pins in the third set;

selecting a fourth location representative of the fourth set of pins based on the additional reference points associated with the pins in the fourth set;

determining a second relative displacement of the third and fourth locations along the second reference axis; and generating a quantitative measure of inclination of the integrated circuit relative to at least one of the first and second reference axes based on the first and second relative displacements.

3. The method of claim 1, wherein the step of detecting coordinates of pin termini include steps of:

generating a first density projection for a first image area, the first image area encompassing termini of the first set of pins, the first density projection integrating pixel density values along discrete increments of the first reference axis;

determining a first coordinate of an individual pin terminus based on a change in first density projection;

generating a second density projection for the first image area, the second density projection integrating pixel density values along discrete increments of the second reference axis; and determining a second coordinate of the individual pin terminus based on a change in second density projection.

4. The method of claim 3, wherein the step of determining a first coordinate includes a step of determining a coordinate where a rate of change of the first density projection satisfies a first criterion.

5. The method of claim 3, wherein the step of determining a first coordinate includes a step of determining a coordinate where a rate of change of the first density projection exceeds a threshold value.

6. The method of claim 1, wherein the step of selecting a first location includes a step of selecting, as one coordinate of the first location, a position substantially along a line segment connecting the reference points associated with the pins in the first set.

7. The method of claim 1, wherein the step of selecting a first location includes a step of selecting, as one coordinate of the first location, a position substantially at a midpoint of a line segment connecting the reference points associated with the pins in the first set.

8. The method of claim 1 further comprising the step of adjusting the inclination of the integrated circuit according to the measured inclination.

9. An electronic method of measuring the orientation of an integrated circuit having a first, a second, a third and a fourth set of pins, the first and second sets of pins being located on opposing sides of the integrated circuit wherein a line extending between the first and second sets of pins defines a first axis of the integrated circuit, the third and fourth sets of pins also being located on opposing sides of the integrated circuit wherein a line extending between the third and fourth sets of pins defines a second axis of the integrated circuit, the method comprising steps of:

acquiring a pixel image of the integrated circuit, the image oriented relative to a reference coordinate system having a first reference axis and a second reference axis, the pixel image having a first pixel axis corresponding to the first axis of the integrated circuit and a second pixel axis corresponding to the second axis of the integrated circuit, the first pixel axis being parallel to one of the first and the second reference axis and the second pixel axis being parallel to a remaining other of the first and the second reference axis if the integrated circuit is disposed at a zero angle of inclination, the first pixel axis being disposed at a non-zero angle with respect to one of the first and the second reference axis and the second pixel axis being disposed at a non-zero angle with respect to a remaining other of the first and the second reference axis if the integrated circuit is disposed at a non-zero angle of inclination, pixels in the pixel image representing relative darknesses of the integrated circuit and a background at discrete locations;

generating density projections of the pins in each of the first, second, third and fourth sets of pins along the first and the second reference axes;

detecting coordinates, in the first and the second reference axes, of termini of pins in the first, second, third and fourth sets of pins, from the density projections of the first, second, third and fourth sets of pins;

determining reference points corresponding to the pins in the first, second, third and fourth sets of pins based on the detected coordinates of termini of the pins in the first, second, third and fourth sets of pins, each pin having one reference point associated therewith, the reference points associated with pins in a same set of pins being aligned in parallel to one of the first and second reference axes;

selecting first, second, third and fourth set-representative locations, each representative of one of the first, second, third and fourth sets of pins, respectively, based on the reference points associated with the pins in the first, second, third and fourth sets, respectively;

determining a first relative displacement of the first and second set-representative locations along one of the first and the second reference axis;

determining a second relative displacement of the second and third set-representative locations along a remaining other of the first and the second reference axis; and generating a quantitative measure of inclination of the integrated circuit relative to the first and the second axes based on the first and second relative displacements.

10. The method of claim 9 wherein the step of detecting coordinates of termini include steps of:

generating a first density projection for a first image area, the first image area encompassing termini of the first set of pins, the first density projection integrating pixel density values along discrete increments of the first reference axis;

determining a first coordinate of an individual pin terminus based on a rate of change in the first density projection;

generating a second density projection for the first image area, the second density projection integrating pixel density values along discrete increments of the second reference axis; and determining a second coordinate of the individual pin terminus based on a rate of change in second density projection.

11. The method of claim 9, wherein the step of selecting set-representative locations includes a step of selecting, as one coordinate of one set-representative location, a position substantially along a line segment connecting the reference points associated with the pins in a set.

12. The method of claim 9 wherein the step of selecting set-representative locations includes a step of selecting, as one coordinate of one location, a position substantially at a midpoint of a line segment connecting the reference points associated with the pins in a set.

13. An electronic method of mounting an integrated circuit on a circuit board, the integrated circuit having a first, a second, a third and a fourth set of pins, the first and second sets of pins being located on opposing sides of the integrated circuit wherein a line extending between the first and second sets of pins defines a first axis of the integrated circuit, the third and fourth sets of pins also being located on opposing sides of the integrated circuit wherein a line extending between the third and fourth sets of pins defines a second axis of the integrated circuit, the method comprising steps of:

acquiring a pixel image of the integrated circuit, the image oriented relative to a reference coordinate system having a first reference axis and a second reference axis, the pixel image having a first pixel axis corresponding to the first axis of the integrated circuit and a second pixel axis corresponding to the second axis of the integrated circuit, the first pixel axis being parallel to one of the first and the second reference axis and the second pixel axis being parallel to a remaining other of the first and the second reference axis if the integrated circuit is disposed at a zero angle of inclination, the first pixel axis being disposed at a non-zero angle with respect to one of the first and the second reference axis and the second pixel axis being disposed at a non-zero angle with respect to a remaining other of the first and the second reference axis if the integrated circuit is disposed at a non-zero angle of inclination, the pixels representing relative darknesses of the integrated circuit and a background at discrete locations;

generating density projections of the pins in each of the first, second, third and fourth sets of pins along the first and second reference axes;

detecting coordinates, in the first and second reference axes, of termini of pins in the first, second, third and fourth sets of pins, from the density projections of the first, second, third and fourth sets of pins;

determining reference points corresponding to the pins in the first, second, third and fourth sets of pins based on the detected coordinates of termini of the pins in the first, second, third and fourth sets of pins, each pin having one reference point associated therewith, the reference points associated with pins in a same set of pins being aligned in parallel to one of the first and second reference axes;

selecting set-representative locations, each representative of one of the first, second, third and fourth sets of pins based on the reference points associated with the pins in the first, second, third and fourth sets;

determining a first relative displacement of the first and second locations along one of the first and the second reference axis;

determining a second relative displacement of the second and third locations along one of the first and the second reference axis;

generating a quantitative measure of inclination of the integrated circuit relative to the first and the second reference axis based on the first and second relative displacements; and adjusting the orientation of the integrated circuit relative to a circuit board according to the measured inclination prior to mounting the integrated circuit on the circuit board.

14. The method of claim 13 wherein the step of detecting coordinates of termini include steps of:

generating a first density projection for a first image area, the first image area encompassing termini of the first set of pins, the first density projection integrating pixel density values along discrete increments of the first reference axis;

determining a first coordinate of an individual pin terminus based on a rate of change in the first density projection;

generating a second density projection for the first image area, the second density projection integrating pixel density values along discrete increments of the second reference axis; and determining a second coordinate of the individual pin terminus based on a rate of change in second density projection.

15. The method of claim 13 wherein the step of selecting set-representative locations includes a step of selecting, as one coordinate of one set-representative location, a position substantially along a line segment connecting the reference points associated with the pins in a set.

16. The method of claim 13 wherein the step of selecting set-representative locations includes a step of selecting, as one coordinate of one location, a position substantially at the midpoint of a line segment connecting the reference points associated with the pins in a set.

* * * * *